United States Patent [19]
Gose

[11] Patent Number: 5,475,340
[45] Date of Patent: Dec. 12, 1995

[54] ACTIVE BIASING CIRCUIT FOR AN EPITAXIAL REGION IN A FAULT-TOLERANT, VERTICAL PNP OUTPUT TRANSISTOR

[75] Inventor: Mark W. Gose, Kokomo, Ind.

[73] Assignee: Delco Electronics Corporation, Kokomo, Ind.

[21] Appl. No.: 247,816

[22] Filed: May 23, 1994

[51] Int. Cl.⁶ .......................... H02J 1/00; H03K 17/60; H01L 29/00
[52] U.S. Cl. .......................... 327/565; 327/478; 327/482; 327/530; 327/564; 257/546
[58] Field of Search ...................... 327/478, 479, 327/482, 530, 545, 564, 565; 257/546, 557

[56] References Cited

U.S. PATENT DOCUMENTS

| | | | |
|---|---|---|---|
| 3,636,381 | 1/1972 | Press | 327/530 |
| 3,829,709 | 8/1974 | Maigret et al. | 327/564 |
| 4,291,319 | 9/1981 | Carinalli | 357/13 |
| 4,426,658 | 1/1984 | Gontowski, Jr. | 357/48 |
| 4,543,593 | 9/1985 | Fujita | 357/48 |
| 4,577,211 | 3/1986 | Bynum et al. | 357/34 |
| 4,825,275 | 4/1989 | Tomassetti | 257/570 |
| 4,972,247 | 11/1990 | Patterson et al. | 257/546 |
| 5,021,860 | 6/1991 | Bertotti et al. | 357/48 |
| 5,051,612 | 9/1991 | Agiman | 307/296.2 |
| 5,132,866 | 7/1992 | Raciti et al. | 361/56 |
| 5,179,432 | 1/1993 | Husher | 257/552 |
| 5,300,805 | 4/1994 | Demicheli et al. | 327/564 |

Primary Examiner—Terry Cunningham
Attorney, Agent, or Firm—Jimmy L. Funke

[57] ABSTRACT

A biasing circuit (30) for an output vertical pnp transistor (10) formed in an integrated circuit and having an outer epitaxial region (20) includes a biasing vertical pnp transistor (33) and a comparator (38). Biasing circuit (30) is electrically connected to the integrated circuit voltage supply and the outer epitaxial region (20) of the output vertical pnp transistor (10) for electrically connecting the outer epitaxial region (20) to the voltage supply when the voltage at an output terminal (23) does not exceed the supply voltage and electrically disconnecting the outer epitaxial region (20) from the voltage supply when the voltage at the output terminal (23) exceeds the supply voltage, whereby improper operation of and damage to the integrated circuit upon the occurrence of an external fault condition is at least minimized.

2 Claims, 2 Drawing Sheets

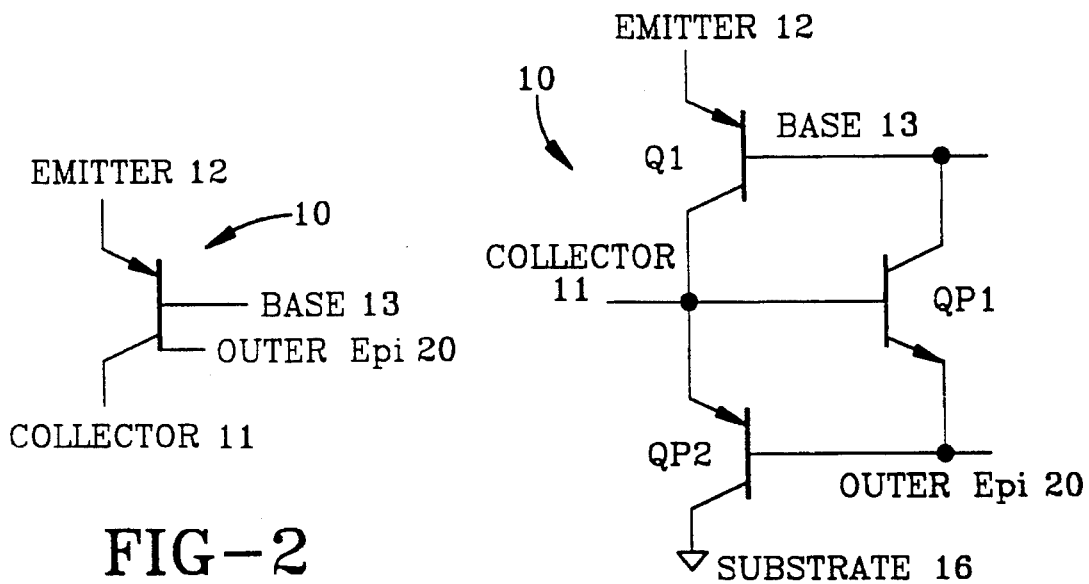
FIG-2
FIG-3
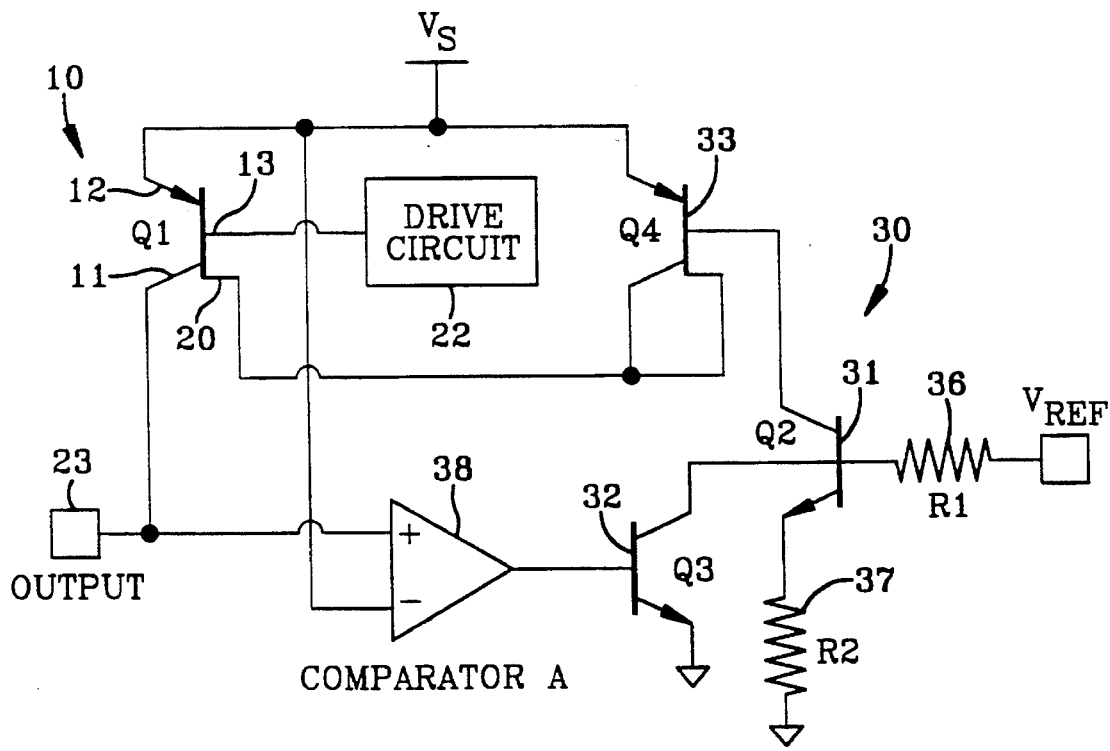
FIG-4

ACTIVE BIASING CIRCUIT FOR AN EPITAXIAL REGION IN A FAULT-TOLERANT, VERTICAL PNP OUTPUT TRANSISTOR

TECHNICAL FIELD

The present invention relates generally to bipolar, monolithic integrated circuits. More particularly, the present invention relates to integrated circuits including vertically oriented pnp output transistors. Still more specifically, the present invention pertains to fault-tolerant biasing circuits for an epitaxial region in such vertical pnp output transistors.

BACKGROUND ART

Electrical systems in motor vehicles are subject to a variety of fault conditions that produce a wide spectrum of potentials at the output of electrical devices such as integrated circuits ("ICs"). For example, in large measure due to the different ground potentials occurring throughout the vehicle chassis, a short to ground fault may result in a potential in the range of zero to −1 or −2 Volts relative to the ground of an IC exposed to the fault. Likewise, because motor vehicle electrical systems may operate from either unswitched battery or switched battery, the output of an IC may be shorted to the battery supply even when no supply voltage is electrically connected to the IC. Of course, the output device in electrical devices such as ICs must be protected against damage by such faults.

A common IC output device employed in motor vehicle electrical systems is the vertical pnp transistor. The damage such devices may incur as a result of the various possible faults will depend upon the device's external electrical connection, internal geometry and biasing. Typically a vertical pnp transistor used as an output transistor will be externally electrically connected in a common emitter configuration with its emitter electrically connected to the supply and its collector electrically connected to the output. Moreover, in junction isolation devices the p-substrate is commonly electrically connected to ground potential in order that the isolation p-n junctions be reverse-biased.

Vertical pnp transistors fabricated in silicon based bipolar monolithic ICs with epitaxy and diffusion processes include a heavily doped $p^+$ buried collector that is isolated from the p-substrate by an n buried layer. This geometry results in an outer epitaxial (epitaxial is hereinafter abbreviated as "epi") region that is isolated from the epi region that forms the base of the device. Known techniques for biasing the outer epi region of a vertical pnp transistor include electrically connecting the same to the collector of the vertical pnp transistor or to the supply, or allowing the same to float.

Conventionally the outer epi region of a vertical pnp transistor is electrically connected to its collector to eliminate the possibility of activation of parasitic devices. However, in this configuration a short to −2 V on the collector will forward bias the outer epi to substrate diode, resulting in excessive current from the output being pulled through the substrate and possibly producing improper circuit operation including latch up.

Improper circuit operation from a short to ground may be avoided by allowing the potential of the outer epi to float. The collector could now go below ground potential without risk of the outer epi forward biasing through the substrate. Unfortunately, when the collector is at a high potential, reverse bias leakage current from the outer epi to the substrate will act as the base current to a parasitic pnp transistor. This parasitic transistor then begins to conduct and pulls current from the output at the same time the output transistor is engaged in sourcing current to the output load, a clearly undesirable and intolerable condition that substantially worsens at higher temperatures as a result of increased leakage current.

U.S. Pat. No. 4,577,211 to Bynum et al., teaches the active biasing of an epi pocket, containing p regions tied to supply, in order to protect against said p regions going below ground. However, it does not address having two p regions in an epi pocket with one tied to supply and the other p region tied to an output that can be shorted to a voltage greater than supply Additionally, it is known that improper circuit operation from a short to ground also may be avoided by electrically connecting the outer epi to the supply, which as previously noted is also electrically connected to the emitter. In this configuration the collector can be taken below the p-substrate ground potential and any outer epi to substrate reverse bias leakage current would get pulled out of the supply. However, if the collector of the vertical pnp transistor was shorted to battery at the same time supply is at ground potential (which means that the emitter of the vertical pnp transistor, also electrically connected to supply, is at ground potential), the parasitic pnp transistor would turn on and conduct current to the p-substrate. This could damage the load or destroy the IC.

Thus, for the common vertical pnp transistor electrically connected in the common output configuration, all possible passive biasing arrangements allow unacceptable operation or produce significant damage in the event of one or more types of faults.

SUMMARY OF THE INVENTION

It is, therefore, an object of the present invention to provide a biasing arrangement for a vertical pnp output transistor in an IC which precludes improper operation and damage to the IC and/or external load irrespective of the fault condition that may occur at the output.

It is another object of the present invention to provide a device, as above, in which both shorts to negative voltages with respect to the IC's substrate ground do not produce excessive substrate current flow or latching, and shorts to voltages greater than the supply voltage do not activate parasitic devices.

It is yet another object of the present invention to provide a device, as above, in which improper operation and damage are precluded when the device is employed in a motor vehicle electrical system.

These and other objects and advantages of the present invention over existing prior art forms will become more apparent and fully understood from the following description in conjunction with the accompanying drawings.

In general, a biasing circuit for an output transistor includes a voltage supply; an output vertical pnp transistor formed in an integrated circuit, the output vertical pnp transistor having an outer epitaxial region and a collector, the collector electrically connected to an output terminal; and, a biasing circuit. The biasing circuit is electrically connected to the voltage supply and the epitaxial region of the output vertical pnp transistor for electrically connecting the outer epitaxial region to the voltage supply when the voltage at said output terminal does not exceed the supply voltage and electrically disconnecting the outer epitaxial region from the voltage supply when the voltage at the output terminal exceeds the supply voltage, whereby improper operation of and damage to said integrated circuit upon the occurrence of an external fault condition is at least minimized.

BRIEF DESCRIPTION OF THE DRAWINGS

FIG. 2 is a schematic representation of a vertical pnp transistor as illustrated in FIG. 1, schematically depicting the outer epitaxial region.

FIG. 3 is a schematic representation of a vertical pnp transistor as illustrated in FIG. 1 also schematically depicting the parasitic devices resulting from the geometry of the vertical pnp transistor.

FIG. 4 is a schematic representation of a vertical pnp transistor as illustrated in FIG. 1 also schematically depicting the biasing arrangement in accordance with the concept of the present invention.

PREFERRED EMBODIMENT FOR CARRYING OUT THE INVENTION

Figure 1:
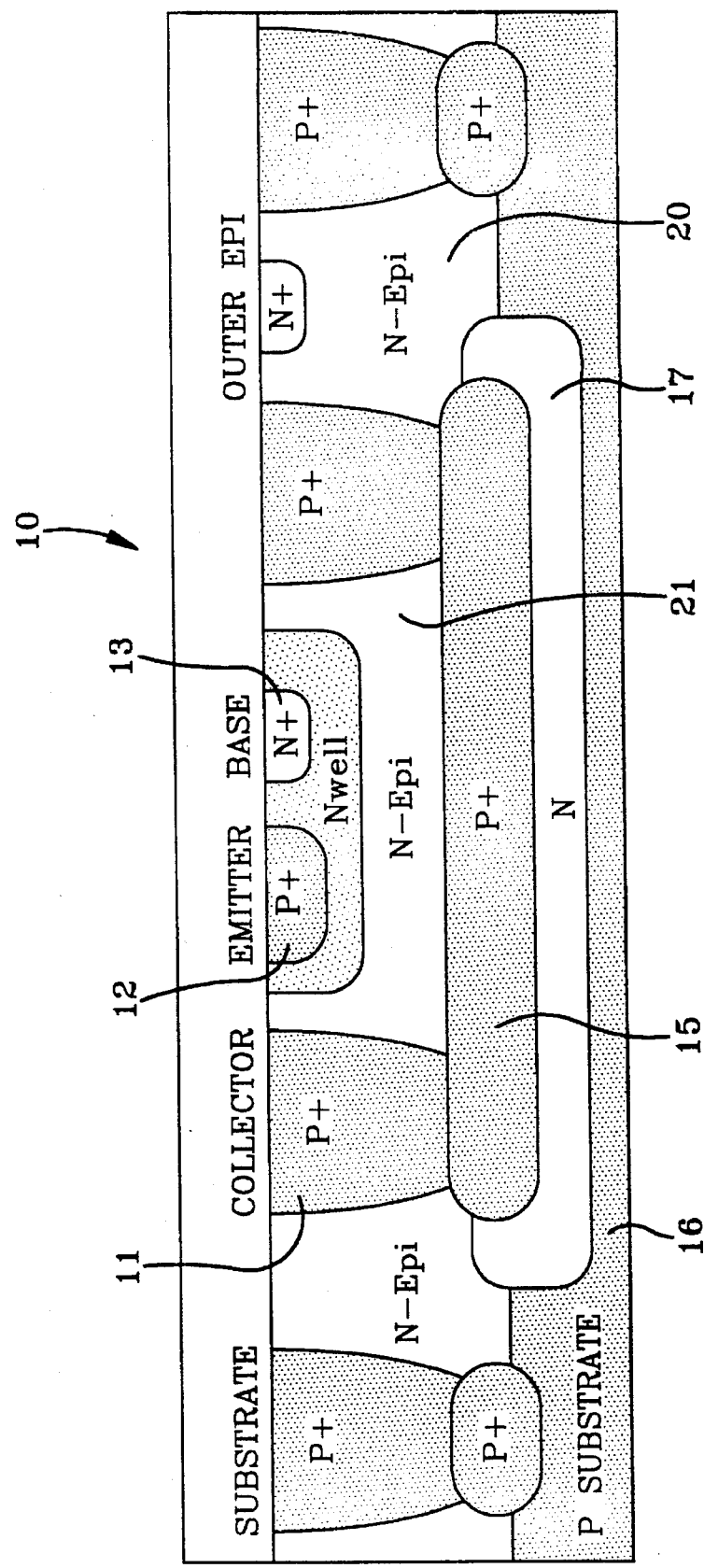
FIG. 1 is a cross section of a vertical pnp transistor in a junction isolated bipolar, monolithic integrated circuit.

FIG. 1 presents a cross sectional view of a single, vertical pnp transistor in a junction isolated bipolar, monolithic IC, generally indicated by the reference numeral 10, having a collector 11, emitter 12 and base 13. Vertical pnp transistors fabricated in silicon based bipolar monolithic ICs with epitaxy and diffusion processes include a heavily doped p$^+$ buried collector region 15 that is isolated from the p-substrate 16 by an n buried layer 17. This geometry results in an outer epitaxial (epitaxial is hereinafter abbreviated as "epi") region 20 that is isolated from the epi region 21 that forms the base of the device. The vertical pnp transistor 10 of FIG. 1, which also may be referred to with the designator Q1 as shown in FIGS. 3 and 4, may be represented schematically with the symbol shown in FIG. 2 in which the outer epitaxial region 20 is also schematically depicted.

A review of the geometry of vertical pnp transistor 10 reveals the inherent inclusion of two parasitic transistors, QP1 and QP2, as shown in FIG. 3. The skilled artisan will appreciate that parasitic pnp transistor QP2 is the device that pulls current from the output when outer epi region 20 is allowed to float and collector 11 is at an elevated voltage, since leakage current from the outer epi to substrate acts as base current for such transistor. Also, QP2 is the device that conducts current to p-substrate 16 when outer epi region 20 is electrically connected to the emitter 12 and collector 11 is shorted to any voltage greater than the voltage on emitter 12.

FIG. 4 illustrates an exemplary active biasing circuit for vertical pnp transistor 10 in accordance with the concept of the present invention, and is generally indicated by the numeral 30. Vertical pnp transistor 10 is electrically connected in the common manner for such an output transistor with the desired drive circuit 22 electrically connected to its base 13, its collector 11 to output terminal 23 and its emitter to the supply voltage V$_s$. Exemplary active biasing circuit 30 includes npn transistors 31, 32 (which also may be referred to with the designators Q2 and Q3, respectively), vertical pnp transistor 33 (which also may be referred to with the designator Q4), resistors 36, 37, and comparator 38.

Vertical pnp transistor 33 is used to bias outer epi region 20 of vertical pnp transistor 10, and has its collector and outer epi region electrically connected to the outer epi 20 of vertical pnp transistor 10, its emitter electrically connected to the supply voltage V$_s$, and its base electrically connected to the collector of npn transistor 31. The base of npn transistor 31 and the collector of npn transistor 32 are electrically connected to one end of resistor 36 the opposite end of which is electrically connected to a source of fixed voltage, V$_{ref}$. The emitter of npn transistor 31 is electrically connected to one end of resistor 37. The opposite end of resistor 37, and the emitter of npn transistor 32 are both electrically connected to ground. The inverting input of comparator 38 is electrically connected to supply V$_s$, its noninverting input electrically connected to collector 11 of vertical pnp transistor 10 and output terminal 23, and its output electrically connected to the base of npn transistor 32.

Vertical pnp transistor 33 is used to bias outer epi region 20 of vertical pnp transistor 10 and selectively switch outer epi region 20 from effective electrical connection with supply V$_s$ to floating isolation. The operation of vertical pnp transistor 33 is controlled by its base current, which in the biasing configuration depicted in FIG. 4, is in turn a function the collector current of npn transistor 31. The base current for vertical pnp transistor 33 is set up by reference voltage V$_{ref}$, along with npn transistor 31 and its resistor 37. Ignoring its negligible base current, the collector current of npn transistor 31 may be expressed as the following:

$$I_{cQ2}=[V_{ref}-V_{beQ2}]/R_{37}$$

where $I_{cQ2}$ is the collector current of npn transistor 31, V$_{ref}$ is the reference voltage, V$_{beQ2}$ is the voltage between the base and emitter terminals of npn transistor 31, and R$_{37}$ is the resistance of resistor 37.

Operation of biasing circuit 30 is straightforward. Vertical pnp transistor 33 typically operates in a saturated condition because the outer epi region of vertical pnp transistor 10 is reversed biased to collector 11 and appears as a high impedance. Comparator 38 continually monitors and compares the voltages at output terminal 23 and supply V$_s$. Under normal operating conditions comparator 38 controls the base current to npn transistor 32 to keep it in cutoff, allowing vertical pnp transistor 33 to remain in saturation. This in turn permits collector 11 of the output vertical pnp transistor 10 to freely operate at a potential below ground up to the supply voltage without improper operation or damage.

Upon the occurrence of a fault condition where output terminal 23 is shorted to a voltage greater than the supply voltage, comparator 38 generates an output to the base of npn transistor 32, turning the later transistor on and pulling the base of npn transistor 31 to ground. This terminates current into the base of vertical pnp transistor 33 and allows outer epi region 20 of vertical pnp transistor 10 to float. Thereafter if the voltage at collector 11 becomes larger than the supply voltage excessive current cannot be drawn through the output terminal into the IC. Moreover, because the base of parasitic pnp transistor QP2 is floated, only minimal leakage current will result, tolerable under fault conditions.

Thus, the active biasing circuit of the present invention should be understood to continually monitor and compare the output voltage with the supply voltage, and control the base current to a second vertical pnp transistor to selectively electrically connect and disconnect the epi region of a pnp output transistor to and from the supply voltage. In other words, the epi region is made to float upon the occurrence of a fault in which the output voltage exceeds the supply voltage, and is at all other times electrically connected to the supply voltage. One of ordinary skill will appreciate that in implementing the biasing circuit of the present invention in a monolithic integrated configuration, multiple transistors including Darlington pairs and other known combinations may be employed to effect the intended operation.

Inasmuch as the present invention is subject to variations, modifications and changes in detail, some of which have been noted herein, it is intended that all matter described throughout this entire specification or shown in the accompanying drawings be interpreted as illustrative and not in a limiting sense. It should thus be evident that a device constructed and operated according to the concept of the present invention, and reasonably equivalent thereto, will accomplish the objects of the present invention and otherwise substantially improve the an of biasing a vertical pnp output transistor in an IC so as to preclude improper operation and damage to the IC and/or external load irrespective of the fault condition that may occur at the output.

I claim:

1. A biasing circuit for an output transistor, comprising:

a voltage supply;

an output vertical pnp transistor formed in an integrated circuit, said output vertical pnp transistor having an outer epitaxial region and a collector, said collector electrically connected to an output terminal; and, a biasing circuit including a biasing vertical pnp transistor formed in said integrated circuit having an outer epitaxial region, a collector, an emitter and a base, said collector and said outer epitaxial region of said biasing vertical pnp transistor electrically connected to said outer epitaxial region of said output vertical pnp transistor, and said emitter electrically connected to said voltage supply, and a comparator electrically connected to said output terminal and said voltage supply and generating an output signal for controlling the operating condition of said biasing vertical pnp transistor, said biasing vertical pnp transistor electrically connecting said outer epitaxial region of said output vertical pnp transistor to said voltage supply when the voltage at said output terminal does not exceed said supply voltage and electrically disconnecting said outer epitaxial region of said output vertical pnp transistor from said voltage supply when the voltage at said output terminal exceeds said supply voltage, whereby improper operation of and damage to said integrated circuit upon the occurrence of an external fault condition is at least minimized.

2. A biasing circuit for an output transistor, comprising:

a voltage supply;

an output vertical pnp transistor formed in an integrated circuit, said output vertical pnp transistor having an outer epitaxial region and a collector, said collector electrically connected to an output terminal; and, a biasing circuit including a biasing vertical pnp transistor formed in said integrated circuit having an outer epitaxial region, a collector, an emitter and a base, said collector and said outer epitaxial region of said biasing vertical pnp transistor electrically connected to said outer epitaxial region of said output vertical pnp transistor, and said emitter electrically connected to said voltage supply, a comparator electrically connected to said output terminal and said voltage supply and generating an output signal indicative of whether the potential at said output terminal exceeds the potential of said voltage supply, a first npn transistor having a base electrically connected to a reference voltage, an emitter electrically connected to ground and a collector electrically connected to said base of said biasing vertical pnp transistor, and, a second npn transistor having a base receiving said output signal from said comparator, a collector electrically connected to said base of said first npn transistor, and an emitter electrically connected to ground, said biasing vertical pnp transistor electrically connecting said outer epitaxial region of said output vertical pnp transistor to said voltage supply when the voltage at said output terminal does not exceed said supply voltage and electrically disconnecting said outer epitaxial region of said output vertical pnp transistor from said voltage supply when the voltage at said output terminal exceeds said supply voltage, whereby improper operation of and damage to said integrated circuit upon the occurrence of an external fault condition is at least minimized.

\* \* \* \* \*